(12) United States Patent
Zhang

(10) Patent No.: US 9,666,612 B1
(45) Date of Patent: May 30, 2017

(54) CONDUCTIVE LAYER IN A SEMICONDUCTOR APPARATUS, DISPLAY SUBSTRATE AND DISPLAY APPARATUS HAVING THE SAME, AND FABRICATING METHOD THEREOF

(71) Applicant: BOE TECHNOLOGY GROUP CO., LTD., Beijing (CN)

(72) Inventor: Feng Zhang, Beijing (CN)

(73) Assignee: BOE TECHNOLOGY GROUP CO., LTD., Chaoyang District, Beijing (CN)

( * ) Notice: Subject to any disclaimer, the term of this patent is extended or adjusted under 35 U.S.C. 154(b) by 0 days.

(21) Appl. No.: 15/116,201

(22) PCT Filed: Apr. 6, 2016

(86) PCT No.: PCT/CN2016/078560
§ 371 (c)(1),
(2) Date: Aug. 2, 2016

(87) PCT Pub. No.: WO2017/016237
PCT Pub. Date: Feb. 2, 2017

(30) Foreign Application Priority Data

Jul. 27, 2015 (CN) .......................... 2015 1 0446770

(51) Int. Cl.
*H01L 23/48* (2006.01)
*H01L 27/12* (2006.01)
(Continued)

(52) U.S. Cl.
CPC ........ *H01L 27/124* (2013.01); *H01L 21/2855* (2013.01); *H01L 21/7685* (2013.01);
(Continued)

(58) Field of Classification Search
CPC ........... H01L 21/76877; H01L 21/7685; H01L 21/2855; H01L 23/528; H01L 23/53223;
(Continued)

(56) References Cited

U.S. PATENT DOCUMENTS

| 2002/0110673 | A1* | 8/2002 | Heydarpour | ...... G02F 1/133305 |
| | | | | 428/209 |
| 2005/0093437 | A1 | 5/2005 | Ouyang | |
| 2015/0249183 | A1* | 9/2015 | Hirasawa | ............... C09K 11/00 |
| | | | | 257/98 |

FOREIGN PATENT DOCUMENTS

CN          104362220 A          2/2005

OTHER PUBLICATIONS

International Search Report & Written Opinion mailed Jun. 1, 2016 regarding PCT/CN2016/078560.

* cited by examiner

*Primary Examiner* — Yosef Gebreyesus
(74) *Attorney, Agent, or Firm* — Intellectual Valley Law, P.C.

(57) ABSTRACT

The present application discloses a conductive layer in a semiconductor apparatus, comprising a metal sub-layer and an anti-reflective coating over the metal sub-layer for reducing light reflection on the metal sub-layer; wherein the anti-reflective coating comprises a light absorption sub-layer on the metal sub-layer for reducing light reflection by absorption and a light destructive interference sub-layer on a side of the light absorption layer distal to the metal sub-layer for reducing light reflection by destructive interference; and the metal sub-layer is made of a material comprising M1, wherein M1 is a single metal or a combination of metals; the light absorption sub-layer is made of a material comprising $M2O_aN_b$, wherein M2 is a single metal or a combination of metals, a>0, and b≥0; the light destructive interference sub-layer is made of a material comprising $M3O_c$, wherein M3 is a single metal or a combination of metals, and c>0; the light absorption sub-layer has a refractive index larger than that of the light destructive interference sub-layer.

20 Claims, 3 Drawing Sheets

(51) Int. Cl.
   *H01L 23/528* (2006.01)
   *H01L 21/768* (2006.01)
   *H01L 21/285* (2006.01)
   *H01L 23/532* (2006.01)
   *G02F 1/1335* (2006.01)
   *G02F 1/1362* (2006.01)

(52) U.S. Cl.
   CPC ...... *H01L 21/76877* (2013.01); *H01L 23/528* (2013.01); *H01L 27/1259* (2013.01); *G02F 1/13362* (2013.01); *G02F 1/136286* (2013.01); *H01L 23/53223* (2013.01); *H01L 23/53238* (2013.01); *H01L 23/53266* (2013.01)

(58) Field of Classification Search
   CPC ......... H01L 23/53238; H01L 23/53266; H01L 27/124; H01L 27/1259; G02F 1/13362
   See application file for complete search history.

CONDUCTIVE LAYER IN A SEMICONDUCTOR APPARATUS, DISPLAY SUBSTRATE AND DISPLAY APPARATUS HAVING THE SAME, AND FABRICATING METHOD THEREOF

CROSS-REFERENCE TO RELATED APPLICATION

This application is a national stage application under 35 U.S.C. §371 of International Application No. PCT/CN2016/078560 filed Apr. 6, 2016, which claims priority to Chinese Patent Application No. 201510446770.3, filed Jul. 27, 2015, the contents of which are incorporated by reference in the entirety.

TECHNICAL FIELD

The present invention relates to display technology, more particularly, to a conductive layer in a semiconductor apparatus, a display substrate and a display apparatus having the same, and a fabricating method thereof.

BACKGROUND

In a display substrate, metal lines such as data lines, touch electrodes, and common electrode lines are made of metals having high conductivity, which are materials having high light reflectance. Accordingly, a black matrix array is required in a package substrate (e.g., a color filter substrate) to block the light reflection from these metal lines. Typically, a black matrix is made of a black material having low light reflectance, such as carbon, molybdenum, chromium, etc.

SUMMARY

In one aspect, the present invention provides a conductive layer in a semiconductor apparatus comprising a metal sub-layer and an anti-reflective coating over the metal sub-layer for reducing light reflection on the metal sub-layer.

Optionally, the anti-reflective coating comprises a light absorption sub-layer on the metal sub-layer for reducing light reflection by absorption and a light destructive interference sub-layer on a side of the light absorption layer distal to the metal sub-layer for reducing light reflection by destructive interference.

Optionally, the metal sub-layer is made of a material comprising M1, wherein M1 is a single metal or a combination of metals; the light absorption sub-layer is made of a material comprising $M2O_aN_b$, wherein M2 is a single metal or a combination of metals, a>0, and b≥0; the light destructive interference sub-layer is made of a material comprising $M3O_c$, wherein M3 is a single metal or a combination of metals, and c>0; the light absorption sub-layer has a refractive index larger than that of the light destructive interference sub-layer.

Optionally, the light destructive interference sub-layer has a higher oxygen molar content than the light absorption sub-layer.

Optionally, the metal layer, the light absorption sub-layer and the light destructive interference sub-layer have at least one metal element in common.

Optionally, the light destructive interference sub-layer has a thickness of substantially about $(k*\lambda/4n)$, wherein k is an odd positive integer, $\lambda$ is a wavelength of an ambient light, and n is the refractive index of the light destructive interference sub-layer.

Optionally, the anti-reflective coating further comprises one or more additional sub-layer on a side of the light destructive interference sub-layer distal to the light absorption sub-layer, refractive indexes of the light destructive interference sub-layer and the one or more additional sub-layer sequentially decrease along a direction away from the light absorption sub-layer.

Optionally, the one or more additional sub-layer is made of a material comprising a metal oxide; oxygen molar contents of the light destructive interference sub-layer and the one or more additional sub-layer sequentially increase along a direction away from the light absorption sub-layer.

Optionally, the metal layer, the light absorption sub-layer, the light destructive interference sub-layer, and the one or more additional sub-layer have at least one metal element in common.

Optionally, the light absorption sub-layer has a refractive index in the range of about 3 to about 4; the light destructive interference sub-layer has a refractive index in the range of about 1 to about 2.

Optionally, M1 is selected from the group consisting of aluminum, chromium, copper, molybdenum, titanium, an aluminum/neodymium alloy, a copper/molybdenum alloy, a molybdenum/tantalum alloy, a molybdenum/niobium alloy; $M2O_aN_b$ is selected from the group consisting of $AlO_xN_y$, $CrO_xN_y$, $CuO_xN_y$, $MoO_xN_y$, $TiO_xN_y$, $Al_xNd_yO_zN_w$, $Cu_xMo_yO_zN_w$, $Mo_xTa_yO_zN_w$, $Mo_xNb_yO_zN_w$; and $M3O_c$ is selected from the group consisting of $AlO_x$, $CrO_x$, $CuO_x$, $MoO_x$, $TiO_x$, $Al_xNd_yO_z$, $Cu_xMo_yO_z$, $Mo_xTa_yO_z$, $Mo_xNb_yO_z$.

In another aspect, the present invention provides a method of fabricating a conductive layer in a semiconductor apparatus comprising a metal sub-layer and an anti-reflective coating for reducing light reflection on the metal sub-layer, the method comprising forming a metal sub-layer on a substrate using a material comprising M1, wherein M1 is a single metal or a combination of metals; forming a light absorption sub-layer over the metal sub-layer for reducing light reflection by absorption using a material comprising $M2O_aN_b$, wherein M2 is a single metal or a combination of metals, a>0, and b≥0; forming a light destructive interference sub-layer on a side of the light absorption sub-layer distal to the metal sub-layer for reducing light reflection by destructive interference using a material comprising $M3O_c$, wherein M3 is a single metal or a combination of metals, and c>0.

Optionally, the light absorption sub-layer has a refractive index larger than that of the light destructive interference sub-layer.

Optionally, the light destructive interference sub-layer has an oxygen molar content higher than the light absorption sub-layer.

Optionally, the light absorption sub-layer and the light destructive interference sub-layer are formed in a single sputtering process using a same sputtering target under different sputtering atmospheres achieved by adjusting a flow rate of one or more reaction gas.

Optionally, the single sputtering process comprises sequentially sputtering a metal material in a first atmosphere corresponding to formation of the light absorption sub-layer and a second atmosphere corresponding to formation of the light destructive interference sub-layer; the first atmosphere comprises an oxygen-containing reactive gas or a combination of an oxygen-containing reactive gas and a nitrogen-containing reactive gas; the second atmosphere is free of the nitrogen-containing reactive gas and has a higher oxygen content than the first atmosphere.

Optionally, the metal sub-layer, the light absorption sub-layer, and the light destructive interference sub-layer are formed in a single sputtering process, the single sputtering process further comprises sputtering the metal material in a third atmosphere prior to sputtering the metal material in the first atmosphere.

Optionally, the metal layer, the light absorption sub-layer and the light destructive interference sub-layer have at least one metal element in common.

Optionally, the light destructive interference sub-layer is formed to have a thickness of substantially about $(k*\lambda/4n)$, wherein k is an odd positive integer, $\lambda$ is a wavelength of an ambient light, and n is the refractive index of the light destructive interference sub-layer.

Optionally, the method further comprises forming one or more additional sub-layer on a side of the light destructive interference sub-layer distal to the light absorption sub-layer, wherein refractive indexes of the light destructive interference sub-layer and the one or more additional sub-layer sequentially decrease along a direction away from the light absorption sub-layer.

Optionally, the one or more additional sub-layer is formed using a material comprising a metal oxide; oxygen molar contents of the light destructive interference sub-layer and the one or more additional sub-layer sequentially increase along a direction away from the light absorption sub-layer.

Optionally, the light destructive interference sub-layer and the one or more additional sub-layer are formed in a single sputtering process using a same sputtering target under different sputtering atmospheres, oxygen contents of different sputtering atmospheres sequentially increase in forming sub-layers along a direction away from the light absorption sub-layer.

Optionally, the metal layer, the light absorption sub-layer, and the light destructive interference sub-layer are formed in a single sputtering process using a same sputtering target under different sputtering atmospheres achieved by adjusting a flow rate of one or more reaction gas.

Optionally, the light absorption sub-layer has a refractive index in the range of about 3 to about 4; the light destructive interference sub-layer has a refractive index in the range of about 1 to about 2.

Optionally, M1 is selected from the group consisting of aluminum, chromium, copper, molybdenum, titanium, an aluminum/neodymium alloy, a copper/molybdenum alloy, a molybdenum/tantalum alloy, a molybdenum/niobium alloy; $M2O_aN_b$ is selected from the group consisting of $AlO_xN_y$, $CrO_xN_y$, $CuO_xN_y$, $MoO_xN_y$, $TiO_xN_y$, $Al_xNd_yO_zN_w$, $Cu_xMo_yO_zN_w$, $Mo_xTa_yO_zN_w$, $Mo_xNb_yO_zN_w$; and $M3O_c$ is selected from the group consisting of $AlO_x$, $CrO_x$, $CuO_x$, $MoO_x$, $TiO_x$, $Al_xNd_yO_z$, $Cu_xMo_yO_z$, $Mo_xTa_yO_z$, $Mo_xNb_yO_z$.

In another aspect, the present invention provides a substrate comprising a conductive layer described herein or fabricated by a method described herein.

Optionally, the substrate is a display substrate, and the conductive layer is one or a combination of a gate electrode, a gate line, and a gate line lead wire.

Optionally, the substrate is a display substrate, and the conductive layer is one or a combination of a source/drain electrode, a data line connected to the source/drain electrode, and a data line lead wire thereof.

Optionally, the substrate is a display substrate, and the conductive layer is a common electrode line.

Optionally, the substrate is a display substrate, and the conductive layer is a bridging electrode for connecting touch sensing electrodes.

In another aspect, the present invention provides a display apparatus comprising a substrate described herein.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
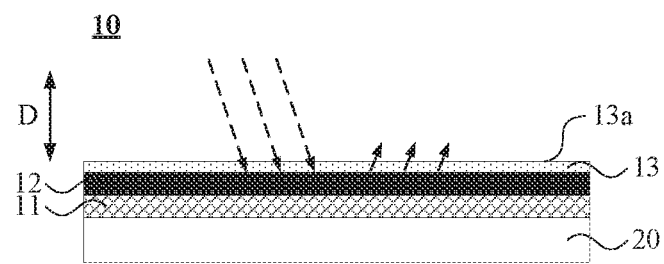
FIG. 1 is a diagram illustrating the structure of a conductive layer in a semiconductor apparatus in some embodiments.

The disclosure will now describe more specifically with reference to the following embodiments. It is to be noted that the following descriptions of some embodiments are presented herein for purpose of illustration and description only. It is not intended to be exhaustive or to be limited to the precise form disclosed.

In manufacturing a display apparatus having a black matrix on the package substrate, it is imperative to precisely align the black matrix with the corresponding metal lines in the array substrate. When the black matrix and the metal lines are misaligned, light reflection form these metal line is not completely blocked, adversely affecting display quality. Accordingly, the black matrix array typically is designed to have a larger area than its corresponding metal lines to ensure light blockage. An increased black matrix area, however, results in a lower aperture ratio of the display apparatus.

The present disclosure provides a novel conductive layer in a semiconductor apparatus (such as a metal line or an electrode in a display apparatus) that obviate the need for a black matrix in the semiconductor apparatus. The novel conductive layer of the present disclosure can be used in any semiconductor apparatus, such as a display apparatus. Accordingly, the present disclosure also provides, inter alia, a novel substrate and a novel display apparatus having the conductive layer, and a novel fabricating method for making the same.

In some embodiments, the conductive layer in a semiconductor apparatus includes a metal sub-layer and an anti-reflective coating over the metal sub-layer. The anti-reflective coating reduces light reflection on the metal sub-layer, such as light reflection of an ambient light or a backlight in the semiconductor apparatus. Optionally, the conductive layer has two anti-reflective coatings, each of which over one side of the metal sub-layer. When the conductive layer includes two anti-reflective coatings on both sides of the metal sub-layer, light reflection of both the ambient light and the backlight may be effectively reduced by the anti-reflective coatings. Optionally, the conductive layer has only one anti-reflective coating over only one side of the metal sub-layer, e.g., a side of the metal sub-layer facing an ambient light or a side of the metal sub-layer facing the backlight. For example, a first side of the conductive layer may be in contact with or electrically connected with another conductive or semi-conductor layer, and a second side is facing the ambient light or the backlight. In that case, the anti-reflective layer is required on only the second side. The anti-reflective coating substantially eliminates or significantly reduces light reflection on the surface of the metal sub-layer, a black matrix is not needed in the semiconductor apparatus. Thus, in some embodiments, the semiconductor apparatus has an increase aperture ratio due to the absence of a black matrix.

In some embodiments, the anti-reflective coating includes a light absorption sub-layer on the metal sub-layer for reducing light reflection by absorption and a light destructive interference sub-layer on a side of the light absorption sub-layer distal to the metal sub-layer for reducing light reflection by destructive interference. Optionally, the metal sub-layer, the light absorption sub-layer, and the light destructive interference sub-layer form a sandwich structure, e.g., the light absorption sub-layer abutting the metal sub-layer and the light destructive interference sub-layer abutting the light absorption sub-layer. Optionally, the anti-reflective coating includes one or more additional sub-layers between the metal sub-layer and the light absorption sub-layer, e.g., additional light absorption sub-layers. Optionally, the anti-reflective coating includes one or more additional sub-layers between the light absorption sub-layer and the light destructive interference sub-layer, e.g., additional light absorption sub-layers or additional light destructive interference sub-layers. Optionally, the anti-reflective coating includes one or more additional sub-layers on a side of the light destructive interference sub-layer, e.g., additional light destructive interference sub-layers. Optionally, the light destructive interference sub-layer is on a side of the light absorption sub-layer facing an incident light (e.g., an ambient light or a backlight).

Optionally, the light destructive interference sub-layer has a thickness such that a light destructive interference occurs in the light destructive interference sub-layer. i.e., a light destructive interference occurs between light reflected by two surfaces of the light destructive interference sub-layer. Optionally, the light destructive interference sub-layer has a thickness d of substantially about $(k*\lambda/4n)$, wherein d is the thickness of the light destructive interference sub-layer, k is an odd positive integer, $\lambda$ is the light wavelength in vacuum, and n is the refractive index of the light destructive interference sub-layer. Optionally, $\lambda$ is a wavelength an ambient light, e.g., an average wavelength or peak wavelength of an ambient light. Optionally, $\lambda$ is a wavelength of a backlight, e.g., an average wavelength or peak wavelength of a backlight. Optionally, $\lambda$ is a wavelength of a white light, e.g., an average wavelength or peak wavelength of a white light. Optionally, the conductive layer has a first anti-reflective coating and a second anti-reflective coating, each over one side of the metal sub-layer. Optionally, the light destructive interference sub-layer in the first anti-reflective coating has a thickness d of substantially about $(k*\lambda/4n)$, wherein $\lambda$ is a wavelength an ambient light; and the light destructive interference sub-layer in the second anti-reflective coating has a thickness d of substantially about $(k*\lambda/4n)$, wherein $\lambda$ is a wavelength a backlight.

In some embodiments, the metal sub-layer is made of a material including M1, wherein M1 is a single metal or a combination of metals (e.g., as metal alloys or laminates). In some embodiments, the light absorption sub-layer is made of a material including $M2O_aN_b$, wherein M2 is a single metal or a combination of metals (e.g., as metal alloys or laminates), N stands for nitrogen element, O stands for oxygen element, a>0, and b≥0. In some embodiments, the light destructive interference sub-layer is made of a material including $M3O_c$, wherein M3 is a single metal or a combination of metals (e.g., as metal alloys or laminates), N stands for nitrogen element, O stands for oxygen element, and c>0. Optionally, the light absorption sub-layer has a refractive index larger than that of the light destructive interference sub-layer. Optionally, the light destructive interference sub-layer has an oxygen molar content higher than the light absorption sub-layer. Optionally, b=0, i.e., the light absorption sub-layer is made of a material including $M2O_a$. Optionally, a<b. Optionally, M1 and M2 are the same, and a<b.

M2 may be the same as or different from M1, or may have at least one element in common with M1. M3 may be the same as or different from M1 and M2, or may have at least one element in common with M1 and/or M2. Optionally, M1, M2, and M3 are different from each other. Optionally, the metal layer, the light absorption sub-layer and the light destructive interference sub-layer have at least one metal element in common, i.e., M1, M2, and M3 have at least one metal element in common. Optionally, M1, M2, and M3 are the same (e.g., a same single metal or a same combination of metals), i.e., the metal sub-layer, the light absorption sub-layer and the light destructive interference sub-layer contain a same set of one or more metal elements.

In some embodiments, M1 is selected from the group consisting of aluminum, chromium, copper, molybdenum, titanium, an aluminum/neodymium alloy, a copper/molybdenum alloy, a molybdenum/tantalum alloy, a molybdenum/niobium alloy. Optionally, $M2O_aN_b$ is selected from the group consisting of $AlO_x$, $CrO_x$, $CuO_x$, $MoO_x$, $TiO_x$, $Al_xNd_yO_z$, $Cu_xMo_yO_z$, $Mo_xTa_yO_z$, $Mo_xNb_yO_z$, $AlO_xN_y$, $CrO_xN_y$, $CuO_xN_y$, $MoO_xN_y$, $TiO_xN_y$, $Al_xNd_yO_zN_w$, $Cu_xMo_yO_zN_w$, $Mo_xTa_yO_zN_w$, $Mo_xNb_yO_zN_w$. Optionally, $M2O_aN_b$ is selected from the group consisting of $AlO_xN_y$, $CrO_xN_y$, $CuO_xN_y$, $MoO_xN_y$, $TiO_xN_y$, $Al_xNd_yO_zN_w$, $Cu_xMo_yO_zN_w$, $Mo_xTa_yO_zN_w$, $Mo_xNb_yO_zN_w$. Optionally, $M3O_c$ is selected from the group consisting of $AlO_x$, $CrO_x$, $CuO_x$, $MoO_x$, $TiO_x$, $Al_xNd_yO_z$, $Cu_xMo_yO_z$, $Mo_xTa_yO_z$, $Mo_xNb_yO_z$. Optionally, M1 is selected from the group consisting of aluminum, chromium, copper, molybdenum, titanium, an aluminum/neodymium alloy, a copper/molybdenum alloy, a molybdenum/tantalum alloy, a molybdenum/niobium alloy; $M2O_aN_b$ is selected from the group consisting of $AlO_xN_y$, $CrO_xN_y$, $CuO_xN_y$, $MoO_xN_y$, $TiO_xN_y$, $Al_xNd_yO_zN_w$, $Cu_xMo_yO_zN_w$, $Mo_xTa_yO_zN_w$, $Mo_xNb_yO_zN_w$; and $M3O_c$ is selected from the group consisting of $AlO_x$, $CrO_x$, $CuO_x$, $MoO_x$, $TiO_x$, $Al_xNd_yO_z$, $Cu_xMo_yO_z$, $Mo_xTa_yO_z$, $Mo_xNb_yO_z$. Optionally, M1 is selected from the group consisting of aluminum, chromium, copper, molybdenum, titanium, an aluminum/neodymium alloy, a copper/molybdenum alloy, a molybdenum/tantalum alloy, a molybdenum/niobium alloy; $M2O_aN_b$ is selected from the group consisting of $AlO_x$, $CrO_x$, $CuO_x$, $MoO_x$, $TiO_x$, $Al_xNd_yO_z$, $Cu_xMo_yO_z$, $Mo_xTa_yO_z$, $Mo_xNb_yO_z$, $AlO_xN_y$, $CrO_xN_y$, $CuO_xN_y$, $MoO_xN_y$, $TiO_xN_y$, $Al_xNd_yO_zN_w$, $Cu_xMo_yO_zN_w$, $Mo_xTa_yO_zN_w$, $Mo_xNb_yO_zN_w$; and $M3O_c$ is selected from the group consisting of $AlO_x$, $CrO_x$, $CuO_x$, $MoO_x$, $TiO_x$, $Al_xNd_yO_z$, $Cu_xMo_yO_z$, $Mo_xTa_yO_z$, $Mo_xNb_yO_z$. Optionally, M1, M2, and M3 are the same.

In some embodiments, the anti-reflective coating further includes one or more additional sub-layer on a side of the light destructive interference sub-layer distal to the light absorption sub-layer, refractive indexes of the light destructive interference sub-layer and the one or more additional sub-layer sequentially decrease along a direction away from the light absorption sub-layer. Optionally, refractive indexes of the light absorption sub-layer, the light destructive interference sub-layer, and the one or more additional sub-layer sequentially decrease along a direction away from the metal sub-layer.

In some embodiments, the one or more additional sub-layer is made of a material comprising a metal oxide. Optionally, oxygen molar contents of the light destructive interference sub-layer and the one or more additional sub-layer sequentially increase along a direction away from the light absorption sub-layer. Optionally, oxygen molar contents of the light absorption sub-layer, the light destructive interference sub-layer, and the one or more additional sub-layer sequentially increase along a direction away from the light absorption sub-layer. For example, the light absorption sub-layer may have a refractive index in the range of about 3 to about 4, and the light destructive interference sub-layer and the one or more additional sub-layer may have a refractive index in the range of about 1 to about 2.

In another aspect, the present disclosure provides a method of fabricating a conductive layer in a semiconductor apparatus as described herein, e.g., a conductive layer having a metal sub-layer and an anti-reflective coating. In some embodiments, the method includes forming an anti-reflective coating over the metal sub-layer for reducing light reflection on the metal sub-layer. The anti-reflective coating reduces light reflection on the metal sub-layer, such as light reflection of an ambient light or a backlight in the semiconductor apparatus. Optionally, the method includes forming two anti-reflective coatings over the metal sub-layer, each of which is formed over one side of the metal sub-layer. When the conductive layer includes two anti-reflective coatings one both sides of the metal sub-layer, light reflection of both the ambient light and the backlight may be effectively reduced by the anti-reflective coatings. Optionally, the method includes forming only one anti-reflective coating over only one side of the metal sub-layer, e.g., a side of the metal sub-layer facing an ambient light or a side of the metal sub-layer facing the backlight. The anti-reflective coating substantially eliminates or significantly reduces light reflection on the surface of the metal sub-layer, a black matrix is not needed in the semiconductor apparatus. Thus, in some embodiments, the semiconductor apparatus fabricated by the present method has an increase aperture ratio due to the absence of a black matrix.

In some embodiments, the method includes forming a light absorption sub-layer over the metal sub-layer, and forming a light destructive interference sub-layer on a side of the light absorption layer distal to the metal sub-layer. Optionally, the method includes forming the light absorption sub-layer abutting the metal sub-layer; and forming the light destructive interference sub-layer abutting the light absorption sub-layer, i.e., the metal sub-layer, the light absorption sub-layer, and the light destructive interference sub-layer form a sandwich structure. Optionally, the method includes forming one or more additional sub-layers between the metal sub-layer and the light absorption sub-layer, e.g., forming additional light absorption sub-layers between the metal sub-layer and the light absorption sub-layer. Optionally, the method includes forming one or more additional sub-layers between the light absorption sub-layer and the light destructive interference sub-layer, e.g., forming additional light absorption sub-layers or additional light destructive interference sub-layers between the light absorption sub-layer and the light destructive interference sub-layer. Optionally, the method includes forming one or more additional sub-layers on a side of the light destructive interference sub-layer distal to the light absorption sub-layer, e.g., forming additional light destructive interference sub-layers on a side of the light destructive interference sub-layer distal to the light absorption sub-layer. Optionally, the light destructive interference sub-layer is formed on a side of the light absorption sub-layer facing an incident light (e.g., an ambient light or a backlight).

Optionally, the method includes forming the light destructive interference sub-layer in such a thickness that a light destructive interference occurs in the light destructive interference sub-layer, i.e., a light destructive interference occurs between light reflected by two surfaces of the light destructive interference sub-layer. Optionally, the method includes forming the light destructive interference sub-layer having a thickness d of substantially about $(k*\lambda/4n)$, wherein d is the thickness of the light destructive interference sub-layer, k is an odd positive integer, $\lambda$ is the light wavelength in vacuum, and n is the refractive index of the light destructive interference sub-layer. Optionally, $\lambda$ is a wavelength an ambient light, e.g., an average wavelength or peak wavelength of an ambient light. Optionally, $\lambda$ is a wavelength of a backlight, e.g., an average wavelength or peak wavelength of a backlight. Optionally, $\lambda$ is a wavelength of a white light, e.g., an average wavelength or peak wavelength of a white light. Optionally, the conductive layer has a first anti-reflective coating and a second anti-reflective coating, each over one side of the metal sub-layer. Optionally, the light destructive interference sub-layer in the first anti-reflective coating has a thickness d of substantially about $(k*\lambda/4n)$, wherein $\lambda$ is a wavelength an ambient light; and the light destructive interference sub-layer in the second anti-reflective coating has a thickness d of substantially about $(k*\lambda/4n)$, wherein $\lambda$ is a wavelength a backlight.

In some embodiments, the method includes forming a metal sub-layer on a substrate using a material comprising M1, wherein M1 is a metal or a combination of metals (e.g., as metal alloys or laminates). In some embodiments, the method includes forming a light absorption sub-layer over the metal sub-layer for reducing light reflection by absorption using a material comprising $M2O_aN_b$, wherein M2 is a metal or a combination of metals (e.g., as metal alloys or laminates), N stands for nitrogen element, O stands for oxygen element, a>0, and b≥0. In some embodiments, the method includes forming a light destructive interference sub-layer on a side of the light absorption sub-layer distal to the metal sub-layer for reducing light reflection by destructive interference using a material comprising $M3O_c$, wherein M3 is a metal or a combination of metals (e.g., as metal alloys or laminates), N stands for nitrogen element, O stands for oxygen element, and c>0. Optionally, the light absorption sub-layer has a refractive index larger than that of the light destructive interference sub-layer. Optionally, the light destructive interference sub-layer has a higher oxygen molar content than the light absorption sub-layer. Optionally, b=0, i.e., the light absorption sub-layer is made of a material including $M2O_a$. Optionally, a<b. Optionally, M1 and M2 are the same, and a<b.

M2 may be the same as or different from M1, or may have at least one element in common with M1. M3 may be the same as or different from M1 and M2, or may have at least one element in common with M1 and/or M2. Optionally, M1, M2, and M3 are different from each other. Optionally, the metal layer, the light absorption sub-layer and the light destructive interference sub-layer have at least one metal element in common, i.e., M1, M2, and M3 have at least one metal element in common. Optionally, M1, M2, and M3 are the same (e.g., a same single metal or a same combination of metals), i.e., the metal sub-layer, the light absorption sub-layer and the light destructive interference sub-layer contain a same set of one or more metal elements.

In some embodiments, M1 is selected from the group consisting of aluminum, chromium, copper, molybdenum, titanium, an aluminum/neodymium alloy, a copper/molybdenum alloy, a molybdenum/tantalum alloy, a molybdenum/niobium alloy. Optionally, $M2O_aN_b$ is selected from the group consisting of $AlO_x$, $CrO_x$, $CuO_x$, $MoO_x$, $TiO_x$, $Al_xNd_yO_z$, $Cu_xMo_yO_z$, $Mo_xTa_yO_z$, $Mo_xNb_yO_z$, $AlO_xN_y$, $CrO_xN_y$, $CuO_xN_y$, $MoO_xN_y$, $TiO_xN_y$, $Al_xNd_yO_zN_w$, $Cu_xMo_yO_zN_w$, $Mo_xTa_yO_zN_w$, $Mo_xNb_yO_zN_w$. Optionally, $M2O_aN_b$ is selected from the group consisting of $AlO_xN_y$, $CrO_xN_y$, $CuO_xN_y$, $MoO_xN_y$, $TiO_xN_y$, $Al_xNd_yO_zN_w$, $Cu_xMo_yO_zN_w$, $Mo_xTa_yO_zN_w$, $Mo_xNb_yO_zN_w$. Optionally, $M3O_c$ is selected from the group consisting of $AlO_x$, $CrO_x$, $CuO_x$, $MoO_x$, $TiO_x$, $Al_xNd_yO_z$, $Cu_xMo_yO_z$, $Mo_xTa_yO_z$, $Mo_xNb_yO_z$. Optionally, M1 is selected from the group consisting of aluminum, chromium, copper, molybdenum, titanium, an aluminum/neodymium alloy, a copper/molybdenum alloy, a molybdenum/tantalum alloy, a molybdenum/niobium alloy; $M2O_aN_b$ is selected from the group consisting of $AlO_xN_y$, $CrO_xN_y$, $CuO_xN_y$, $MoO_xN_y$, $TiO_xN_y$, $Al_xNd_yO_zN_w$, $Cu_xMo_yO_zN_w$, $Mo_xTa_yO_zN_w$, $Mo_xNb_yO_zN_w$; and $M3O_c$ is selected from the group consisting of $AlO_x$, $CrO_x$, $CuO_x$, $MoO_x$, $TiO_x$, $Al_xNd_yO_z$, $Cu_xMo_yO_z$, $Mo_xTa_yO_z$, $Mo_xNb_yO_z$. Optionally, M1 is selected from the group consisting of aluminum, chromium, copper, molybdenum, titanium, an aluminum/neodymium alloy, a copper/molybdenum alloy, a molybdenum/tantalum alloy, a molybdenum/niobium alloy; $M2O_aN_b$ is selected from the group consisting of $AlO_x$, $CrO_x$, $CuO_x$, $MoO_x$, $TiO_x$, $Al_xNd_yO_z$, $Cu_xMo_yO_z$, $Mo_xTa_yO_z$, $Mo_xNb_yO_z$, $AlO_xN_y$, $CrO_xN_y$, $CuO_xN_y$, $MoO_xN_y$, $TiO_xN_y$, $Al_xNd_yO_zN_w$, $Cu_xMo_yO_zN_w$, $Mo_xTa_yO_zN_w$, $Mo_xNb_yO_zN_w$; and $M3O_c$ is selected from the group consisting of $AlO_x$, $CrO_x$, $CuO_x$, $MoO_x$, $TiO_x$, $Al_xNd_yO_z$, $Cu_xMo_yO_z$, $Mo_xTa_yO_z$, $Mo_xNb_yO_z$. Optionally, M1, M2, and M3 are the same.

In some embodiments, the light absorption sub-layer and the light destructive interference sub-layer are formed in a single sputtering process using a same sputtering target under different sputtering atmospheres achieved by adjusting a flow rate of one or more reaction gas (e.g., an oxygen-containing reactive gas and/or a nitrogen-containing reactive gas). For example, the single sputtering process may include sequentially sputtering a metal material in a first atmosphere corresponding to formation of the light absorption sub-layer and a second atmosphere corresponding to formation of the light destructive interference sub-layer. Optionally, the first atmosphere includes an oxygen-containing reactive gas (e.g., $O_2$) or a combination of an oxygen-containing reactive gas (e.g., $O_2$) and a nitrogen-containing reactive gas (e.g. $N_2$, NO, $N_2O$, $NO_2$). Optionally, the second atmosphere is free of the nitrogen-containing reactive gas and has a higher oxygen molar content than the first atmosphere.

Optionally, the metal sub-layer, the light absorption sub-layer, and the light destructive interference sub-layer are formed in a single sputtering process using a same sputtering target under different sputtering atmospheres achieved by adjusting a flow rate of one or more reaction gas (e.g., an oxygen-containing reactive gas and/or a nitrogen-containing reactive gas). For example, the single sputtering process may include sequentially sputtering the metal material in a third atmosphere corresponding to formation of the metal sub-layer, sputtering the metal material in a first atmosphere corresponding to formation of the light absorption sub-layer, and sputtering the metal material in a second atmosphere corresponding to formation of the light destructive interference sub-layer.

In some embodiments, the method further includes forming one or more additional sub-layer on a side of the light destructive interference sub-layer distal to the light absorption sub-layer. Optionally, refractive indexes of the light destructive interference sub-layer and the one or more additional sub-layer sequentially decrease along a direction away from the light absorption sub-layer. Optionally, refractive indexes of the light absorption sub-layer, the light destructive interference sub-layer, and the one or more additional sub-layer sequentially decrease along a direction away from the metal sub-layer.

In some embodiments, the method further includes forming the one or more additional sub-layer using a material comprising a metal oxide in a single sputtering process. Optionally, oxygen molar contents of the light destructive interference sub-layer and the one or more additional sub-layer sequentially increase along a direction away from the light absorption sub-layer. Optionally, oxygen molar contents of the light absorption sub-layer, the light destructive interference sub-layer, and the one or more additional sub-layer sequentially increase along a direction away from the light absorption sub-layer. For example, the light absorption sub-layer may have a refractive index in the range of about 3 to about 4, and the light destructive interference sub-layer and the one or more additional sub-layer may have a refractive index in the range of about 1 to about 2.

In some embodiments, the method further includes forming the light destructive interference sub-layer and the one or more additional sub-layer in a single sputtering process using a same sputtering target under different sputtering atmospheres. Optionally, oxygen molar contents of different sputtering atmospheres sequentially increase in forming sub-layers along a direction away from the light absorption sub-layer.

In some embodiments, the method further includes forming the metal layer, the light absorption sub-layer, and the light destructive interference sub-layer in a single sputtering process using a same sputtering target under different sputtering atmospheres achieved by adjusting a flow rate of one or more reaction gas (e.g., an oxygen-containing reactive gas and/or a nitrogen-containing reactive gas).

Figure 2:
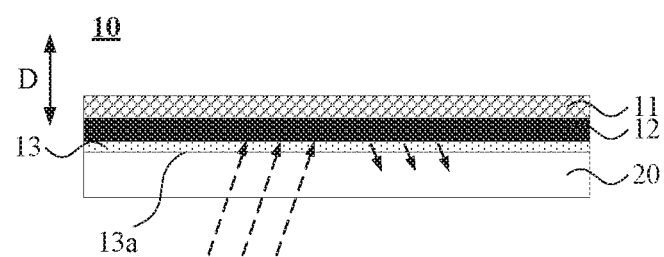
FIG. 2 is a diagram illustrating the structure of a conductive layer in a semiconductor apparatus in some embodiments.
Figure 3:
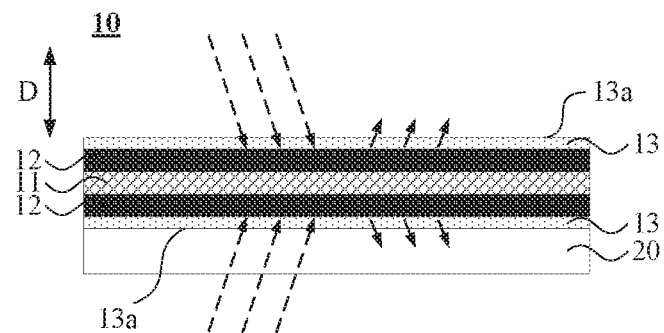
FIG. 3 is a diagram illustrating the structure of a conductive layer in a semiconductor apparatus in some embodiments.
Figure 4:
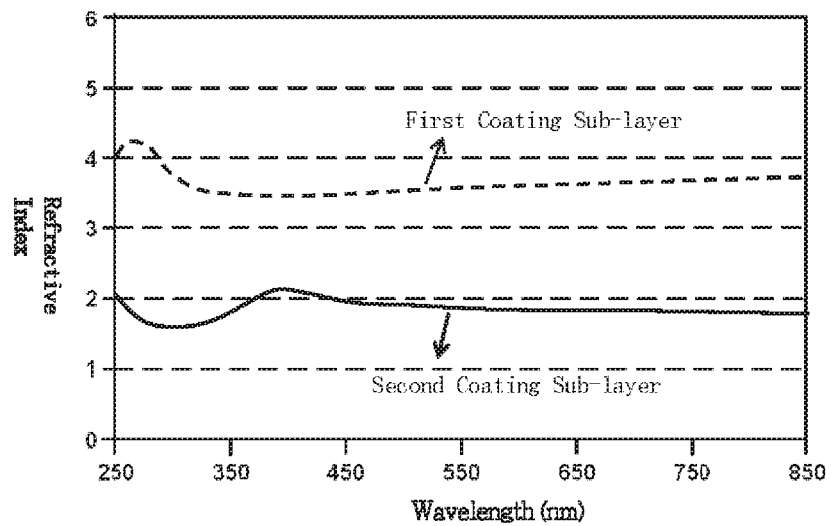
FIG. 4 is a graph showing a comparison between light reflectance of a light absorption sub-layer and that of a light destructive interference sub-layer.

FIGS. 1-3 are diagrams illustrating the structure of a conductive layer in a semiconductor apparatus in some embodiments. Referring to FIGS. 1-3, the conductive layer 10 in the embodiments includes a metal sub-layer 11 on a base substrate 20, a light absorption sub-layer 12 on a side of the metal sub-layer 11 distal to the base substrate 20, and a light destructive interference sub-layer 13 on a side of the light absorption sub-layer 12 distal to the metal sub-layer 11. Optionally, the light absorption sub-layer 12 is a light absorption layer, the light destructive interference sub-layer 13 is a light reflection reducing layer. Optionally, the light absorption sub-layer has a refractive index larger than that of the light destructive interference sub-layer. The light destructive interference sub-layer 13 has a first surface 13a and a second surface opposite to the first surface, the second surface proximal to the light absorption sub-layer 12, the first surface 13a proximal to an incident light (e.g., an ambient light or a backlight) and distal to the light absorption sub-layer 12.

Any appropriate material may be used for making the metal sub-layer 11. For instance, the metal sub-layer 11 may be made of a metal material. The metal material may be a single metal material or a combination of metals (e.g., as metal alloys or laminates), examples of which include, but are not limited to, aluminum, chromium, copper, molybdenum, titanium, an aluminum/neodymium alloy, a copper/molybdenum alloy, a molybdenum/tantalum alloy, a molybdenum/niobium alloy, etc. The metal sub-layer 11 may be made of any appropriate dimension, for example, to ensure a high electrical conductivity when the conductive layer is an electrode layer. In some conductive layers, the metal sub-layer 11 has a thickness in the range of about 1000 Å to about 6000 Å.

In some embodiments, the light destructive interference sub-layer 13 is a transparent sub-layer having a smaller refractive index on the surface of the conductive layer 10. For example, the light absorption sub-layer 13 has a refractive index that is smaller than that of the light destructive interference sub-layer 12. For example, in some conductive layers, the light absorption sub-layer 12 may have a refractive index in the range of about 3 to about 4, whereas the light destructive interference sub-layer 13 may have a refractive index in the range of about 1 to about 2. In some instances, the conductive layer 10 may be designed such that a destructive interference occurs between light reflected by the first surface 13a (light incident surface) of the light destructive interference sub-layer 13 and light reflected by the second surface of the light destructive interference sub-layer 13. As a result of the destructive interference, reflection of light (e.g., an ambient light or a backlight) on the surface of the metal sub-layer 11 can be eliminated or significantly reduced, obviating the need for a black matrix in the semiconductor apparatus.

Specifically, the conductive layer 10 may be designed according to the follow equation to achieve the destructive interference discussed above:

$$d=k*\lambda/4n \quad (1)$$

wherein d is the thickness of the light destructive interference sub-layer 13, k is an odd positive integer, $\lambda$ is the light wavelength in vacuum, and n is the refractive index of the light destructive interference sub-layer 13.

Accompanying a decrease in light reflection from the light destructive interference sub-layer 13, light transmission through the light destructive interference sub-layer 13 increases correspondingly. Accordingly, the conductive layer 10 further includes a light absorption sub-layer 12 underneath the light destructive interference sub-layer 13 to absorb the light transmitted through the light destructive interference sub-layer 13. Optionally, the light absorption sub-layer 12 includes a black material for enhancing light absorption, preventing light reflection on the surface of the metal sub-layer 11. Combining the destructive interference of light in the light destructive interference sub-layer 13 and the enhanced light absorption in the light absorption sub-layer 12, reflection of light (e.g., an ambient light or a backlight) on the surface of the metal sub-layer 11 can be eliminated or significantly reduced, obviating the need for a black matrix in the semiconductor apparatus.

Optionally, the conductive layer 10 is on a base substrate 20. Optionally, the semiconductor apparatus includes one or more layers between the conductive layer 10 and the base substrate 20.

Numerous embodiments may be practiced for making the present conductive layer 10. In some embodiments, the conductive layer 10 is a layer having a light destructive interference sub-layer 13, the first surface of which is proximal to an incident light. The incident light may be an ambient light, or a backlight, or both. For example, the conductive layer 10 may be a conductive layer 10 in a display apparatus, the incident light may be an ambient light on the image display side of the display apparatus. As shown in FIG. 1, the conductive layer 10 includes a metal sub-layer 11, a light absorption sub-layer 12, and a light destructive interference sub-layer 13 sequentially on a base substrate 20. The light destructive interference sub-layer 13 includes a first surface 13a distal to the light absorption sub-layer 12 and a second surface proximal to the light absorption sub-layer 12. The first surface 13a is proximal to an ambient light, i.e., the ambient light shines on the first surface 13a. In part due to the destructive interference of light occurred in the light destructive interference sub-layer 13, reflection of the ambient light on the surface of the metal sub-layer 11 can be eliminated or significantly reduced, resulting in improved contrast and higher display quality.

In another example, the conductive layer 10 is a conductive layer 10 in a liquid crystal display apparatus. In a liquid crystal display apparatus, the liquid crystal layer is illuminated with a backlight in a backlight module. The majority of light provided by the backlight is polarized by a polarizer and the polarized light rotated by the liquid crystal layer. Part of the backlight is not rotated by the liquid crystal layer and may be reflected by a metal layer inside the display apparatus, interfering normal image display. As shown in FIG. 2, the conductive layer 10 includes a metal sub-layer 11, a light absorption sub-layer 12, and a light destructive interference sub-layer 13 sequentially on a base substrate 20. The light destructive interference sub-layer 13 includes a first surface 13a distal to the light absorption sub-layer 12 and a second surface proximal to the light absorption sub-layer 12. The first surface 13a is proximal to the backlight. That is, the backlight shines on the first surface 13a. In part due to the destructive interference of light occurred in the light destructive interference sub-layer 13, reflection of the backlight on the surface of the metal sub-layer can be eliminated or significantly reduced, avoiding interference on normal image display and resulting in higher display quality.

In another example, the conductive layer 10 includes a metal sub-layer 11 having light absorption sub-layers 12 and light destructive interference sub-layers 13 on both sides of the metal sub-layer 11. As shown in FIG. 3, on a first side (the upper side) of the metal sub-layer 11, the conductive layer 10 includes a light absorption sub-layer 12 and a light destructive interference sub-layer 13 sequentially on the metal sub-layer 11. The light destructive interference sub-layer 13 includes a first surface 13a distal to the light absorption sub-layer 12 and a second surface proximal to the light absorption sub-layer 12. The first surface 13a is proximal to an ambient light, i.e., the ambient light shines on the first surface 13a. In part due to the destructive interference of light occurred in the light destructive interference sub-layer 13, reflection of the ambient light on the surface of the metal sub-layer 11 can be eliminated or significantly reduced, resulting in improved contrast and higher display quality. As shown in FIG. 3, on a second side (the lower side) of the metal sub-layer 11, the conductive layer 10 also includes a light absorption sub-layer 12 and a light destructive interference sub-layer 13 sequentially on the metal sub-layer 11. The light destructive interference sub-layer 13 includes a first surface 13a distal to the light absorption sub-layer 12 and a second surface proximal to the light absorption sub-layer 12. The first surface 13a is proximal to the backlight. i.e., the backlight shines on the first surface 13a. In part due to the destructive interference of light occurred in the light destructive interference sub-layer 13, reflection of the backlight on the surface of the metal sub-layer 11 can be eliminated or significantly reduced, avoiding interference on normal image display and resulting in higher display quality.

Based on the above, the present conductive layer 10 has several advantages over the conventional conductive layer. First, the metal sub-layer 11 maintains high electrical conductivity to function as a conductive means in the semiconductor apparatus (e.g., as an electrode). Second, the light absorption sub-layer 12 absorbs light (e.g., the ambient light or the backlight), functioning as a light blockage means similar to a black matrix. Third, the light absorption layer 13 reduces light reflection on the metal sub-layer 11, enhancing display contrast. Combining the destructive interference of light in the light destructive interference sub-layer 13 and the enhanced light absorption in the light absorption sub-layer 12, reflection of light (e.g., an ambient light or a backlight) on the surface of the metal sub-layer 11 (e.g., electrodes, metal lines, and wires) can be eliminated or significantly reduced, obviating the need for a black matrix in the semiconductor apparatus. The present conductive layer 10 overcomes several disadvantages of the conventional conductive layer, such as the complicated fabricating process, the misaligned black matrix issues, and the reduced aperture ratio.

In some embodiments, the light absorption sub-layer 12 is made of a material having a metal oxynitride and/or a metal oxide. A higher oxygen molar content in a metal oxynitride or a metal oxide compound results in a lower refractive index. Accordingly, the light destructive interference sub-layer 13 has an oxygen molar content higher than the light absorption sub-layer 12, and the light absorption sub-layer 12 has a refractive index larger than that of the light destructive interference sub-layer 13.

In some embodiments, the metal element in the metal oxynitride or the metal oxide is, for example, aluminum, chromium, copper, molybdenum, titanium, an aluminum/neodymium alloy, a copper/molybdenum alloy, a molybdenum/tantalum alloy, a molybdenum/niobium alloy, etc. A higher oxygen molar content in the metal oxynitride or the metal oxide results in a relatively more transparent material, whereas a lower oxygen molar content can convert the compound from a transparent material into a black material. Thus, the light destructive interference sub-layer 13 has an oxygen molar content higher than the light absorption sub-layer 12, the light absorption sub-layer 12 is substantially black, and the light destructive interference sub-layer 13 is substantially transparent.

Examples of metal oxides include, but are not limited to, $AlO_x$, $CrO_x$, $CuO_x$, $MoO_x$, $TiO_x$, $Al_xNd_yO_z$, $Cu_xMo_yO_z$, $Mo_xTa_yO_z$, $Mo_xNb_yO_z$, etc. Examples of metal oxynitrides include, but are not limited to, $AlO_xN_y$, $CrO_xN_y$, $CuO_xN_y$, $MoO_xN_y$, $TiO_xN_y$, $Al_xNd_yO_zN_w$, $Cu_xMo_yO_zN_w$, $Mo_xTa_yO_zN_w$, $Mo_xNb_yO_zN_w$, etc.

Optionally, the light destructive interference sub-layer 13 has a thickness in the range of about 300 Å to about 1000 Å. Optionally, the light absorption sub-layer 11 has a thickness in the range of about 300 Å to about 1000 Å.

Optionally, the light destructive interference sub-layer 13 has a multi-layer structure having two or more metal oxide sub-layers having different refractive indexes. Refractive indexes of the two or more light destructive interference sub-layers sequentially decrease along a direction away from the light absorption sub-layer 12.

Optionally, oxygen molar contents of two or more light destructive interference sub-layers sequentially increase along a direction away from the light absorption sub-layer.

Optionally, the light absorption sub-layer 12 and the light destructive interference sub-layer 13 have at least one metal element in common (e.g., all metal elements in both sub-layers are the same). Optionally, the light absorption sub-layer 12 and the light destructive interference sub-layer 13 are formed in a single process (e.g., a single sputtering process).

Optionally, the metal layer 11, the light absorption sub-layer 12 and the light destructive interference sub-layer 13 have at least one metal element in common (e.g., all metal elements in all three sub-layers are the same). Optionally, the metal layer 11, the light absorption sub-layer 12 and the light destructive interference sub-layer 13 are formed in a single process (e.g., a single sputtering process). For example, the metal sub-layer 11 may be formed using a metal (e.g., a single metal or a combination of metals, e.g., as metal alloys or laminates) as the sputtering target. After the metal sub-layer 11 is formed, the light absorption sub-layer 12 and the light destructive interference sub-layer 13 may be formed using the same sputtering target (e.g., the same metal or the same combination of metals) but under different sputtering atmospheres from that for sputtering the metal sub-layer 11 and from each other. For instance, the different sputtering atmospheres may be achieved by including and/or adjusting the flow rate of an oxygen-containing reactive gas (e.g., $O_2$) and/or a nitrogen-containing reactive gas (e.g., $N_2$), thereby increasing the oxygen content and/or the nitrogen content of the sputtering atmosphere. By forming the metal sub-layer 11, the light absorption sub-layer 12, and/or the light destructive interference sub-layer 13 in a single sputtering process, the manufacturing costs can be significantly lowered, and manufacturing efficiency enhanced.

In another aspect, the present disclosure also provides a method of fabricating a conductive layer 10 in a semiconductor apparatus. In some embodiments, the method includes forming a metal sub-layer 11 on a substrate 20; and sequentially forming a light absorption sub-layer 12 and a light destructive interference sub-layer 13 on at least on side of the metal sub-layer 11. The light absorption sub-layer 12 has a refractive index larger than that of the light destructive interference sub-layer 13. The metal sub-layer 11 is made of a metal (e.g., a single metal or a combination of metals. e.g., as metal alloys or laminates). The light absorption sub-layer 12 is formed using a material including a metal oxynitride and/or a metal oxide. The light destructive interference sub-layer 13 is formed using a material including a metal oxide. A higher oxygen molar content in a metal oxynitride or a metal oxide compound results in a lower refractive index. Accordingly, the light destructive interference sub-layer 13 has an oxygen molar content higher than the light absorption sub-layer 12, and the light absorption sub-layer 12 has a refractive index larger than that of the light destructive interference sub-layer 13.

In some embodiments, the light absorption sub-layer 12 and the light destructive interference sub-layer 13 are formed in a single sputtering process by including and/or adjusting the flow rate of an oxygen-containing reactive gas (e.g., $O_2$) and/or a nitrogen-containing reactive gas (e.g., $N_2$), thereby adjusting the oxygen content and/or the nitrogen content of the sputtering atmosphere.

In some embodiments, the method includes forming a light absorption sub-layer 12 by sputtering a metal/alloy sputtering target under an oxygen-containing sputtering atmosphere. Examples of sputtering target materials include, but are not limited to, aluminum, chromium, copper, molybdenum, titanium, an aluminum/neodymium alloy, a copper/molybdenum alloy, a molybdenum/tantalum alloy, a molybdenum/niobium alloy, etc. Accordingly, examples of metal oxides in the light absorption sub-layer 12 include, but are not limited to, $AlO_x$, $CrO_x$, $CuO_x$, $MoO_x$, $TiO_x$, $Al_xNd_yO_z$, $Cu_xMo_yO_z$, $Mo_xTa_yO_z$, $Mo_xNb_yO_z$, etc. Optionally, the method further includes forming a light destructive interference sub-layer 13 by sputtering a metal/alloy sputtering target under an oxygen-containing sputtering atmosphere having an increased oxygen content (e.g., by increasing the oxygen flow rate) as compared to that for the light absorption sub-layer 12.

In some embodiments, the method includes forming a light absorption sub-layer 12 by sputtering a metal/alloy sputtering target under a first sputtering atmosphere containing an oxygen-containing reactive gas and a nitrogen-containing reactive gas (e.g., $O_2$ and $N_2$). Examples of sputtering target materials include, but are not limited to, aluminum, chromium, copper, molybdenum, titanium, an aluminum/neodymium alloy, a copper/molybdenum alloy, a molybdenum/tantalum alloy, a molybdenum/niobium alloy, etc. Accordingly, examples of metal oxides in the light absorption sub-layer 12 include, but are not limited to, $AlO_xN_y$, $CrO_xN_y$, $CuO_xN_y$, $MoO_xN_y$, $TiO_xN_y$, $Al_xNd_yO_zN_w$, $Cu_xMo_yO_zN_w$, $Mo_xTa_yO_zN_w$, $Mo_xNb_yO_zN_w$, etc. Optionally, the method further includes forming a light destructive interference sub-layer 13 by sputtering a metal/alloy sputtering target under a second sputtering atmosphere. The second sputtering atmosphere is nitrogen-free and has an increased oxygen content as compared to that for the light absorption sub-layer 12. The second sputtering atmosphere may be conveniently achieved by adjusting the flow rate of nitrogen-containing reactive gas (e.g., $N_2$) and/or oxygen-containing reactive gas (e.g., $O_2$) in the first sputtering atmosphere. For example, the second sputtering atmosphere may be achieved by discontinuing the nitrogen-containing reactive gas flow and increasing oxygen-containing reactive gas flow in the first sputtering atmosphere. Optionally, the oxygen-containing reactive gas (e.g., $O_2$) flow rate for the first sputtering atmosphere is less than about 10 sccm, and the nitrogen-containing reactive gas (e.g., $N_2$) flow rate for the first sputtering atmosphere is less than about 30 sccm. Optionally, the oxygen-containing reactive gas (e.g., $O_2$) flow rate for the second sputtering atmosphere is less than about 30 sccm, and the nitrogen-containing reactive gas (e.g., $N_2$) flow for the second sputtering atmosphere is discontinued.

Optionally, when the light absorption sub-layer 12 and the light destructive interference sub-layer 13 are formed in a single sputtering process, they are formed in a same reaction chamber and using a same sputtering target. As discussed above, different sub-layers are formed by adjusting the contents of the sputtering atmosphere.

When the light absorption sub-layer 12 and the light destructive interference sub-layer 13 are formed using a same sputtering target, the metal element(s) of these two sub-layers are substantially the same. Optionally, the metal sub-layer 11 is formed using a same metal element(s). Optionally, the metal sub-layer 11 is formed using a material having one or more metal element(s) different from that of the light absorption sub-layer 12 and the light destructive interference sub-layer 13. For example, the metal sub-layer 11 may be made of molybdenum, the light absorption sub-layer 12 may be made of $MoO_xN_y$, and the light destructive interference sub-layer may be made of $MoO_x$. In another example, the metal sub-layer 11 is made of a molybdenum/niobium alloy, the light absorption sub-layer 12 may be made of $Mo_xNb_yO_zN_w$, and the light destructive interference sub-layer may be made of $Mo_xNb_yO_z$. In another example, the metal sub-layer 11 is made of aluminum, the light absorption sub-layer 12 may be made of $MoO_xN_y$, and the light destructive interference sub-layer may be made of $MoO_x$.

Optionally, the step of forming the light destructive interference sub-layer 13 includes forming a multi-layer structure having two or more metal oxide sub-layers having different refractive indexes. Refractive indexes of the two or more light destructive interference sub-layers sequentially decrease along a direction away from the light absorption sub-layer 12.

Optionally, oxygen molar contents of two or more light destructive interference sub-layers sequentially increase along a direction away from the light absorption sub-layer. As a consequence of the increasing oxygen molar contents, refractive indexes of the two or more light destructive interference sub-layers sequentially decrease along a direction away from the light absorption sub-layer 12.

Optionally, the two or more light destructive interference sub-layers are formed by sputtering a metal/alloy sputtering target sequentially under different oxygen-containing sputtering atmospheres. The oxygen contents of sputtering atmospheres corresponding to the two or more light destructive interference sub-layers along a direction away from the light absorption sub-layer 12 sequentially increase sequentially, thereby forming two or more light destructive interference sub-layers having refractive indexes sequentially decreasing along a direction away from the light absorption sub-layer 12.

Optionally, the light absorption sub-layer 12 and the light destructive interference sub-layer 13 have at least one metal element in common. Optionally, the light absorption sub-layer 12 and the light destructive interference sub-layer 13 are formed in a single process (e.g., a single sputtering process).

In some embodiments, the metal sub-layer 11, the light absorption sub-layer 12, and the light destructive interference sub-layer 13 are formed in a single sputtering process, further lowering the manufacturing costs and enhancing the manufacturing efficiency. In some embodiments, the method includes forming a metal sub-layer 11 by sputtering a metal/alloy sputtering target under an argon-containing sputtering atmosphere.

Optionally, the conductive layer is formed on a base substrate. Optionally, the temperature of the base substrate during the sputtering process can be, e.g., about 120° C. The sputtering power may be, e.g., about 12 kW. The argon pressure may be, e.g., about 0.3 Pa. The argon flow rate may be, e.g., about 100 sccm.

Examples of sputtering target materials include, but are not limited to, a single metal (e.g., aluminum, chromium, copper, molybdenum, titanium, etc.) or a combination of metals (e.g., an aluminum/neodymium alloy, a copper/molybdenum alloy, a molybdenum/tantalum alloy, a molybdenum/niobium alloy, etc.). When the sputtering target is of a single metal, the metal sub-layer 11 include the same single metal. When the sputtering target is of an alloy, the metal sub-layer 11 include the same alloy.

Optionally, the metal sub-layer 11 has a thickness in the range of about 1000 Å to about 6000 Å.

Optionally, the method further includes forming the light absorption sub-layer 12 by sputtering the same sputtering target and in the same sputtering chamber for forming the metal sub-layer 11 under a different sputtering atmosphere, e.g., a sputtering atmosphere containing an oxygen-containing reactive gas (e.g., $O_2$) and/or a nitrogen-containing reactive gas (e.g., $N_2$, NO, $N_2O$, $NO_2$). The sputtering atmosphere may be conveniently formed by modifying the sputtering atmosphere for the metal sub-layer 11, e.g., by flowing oxygen- and nitrogen-containing reactive gases into the sputtering chamber.

Optionally, the conductive layer is formed on a base substrate. Optionally, the temperature of the base substrate during the sputtering process can be, e.g., about 120° C. The sputtering power may be, e.g., about 12 kW. The argon pressure may be, e.g., about 0.3 Pa. The argon flow rate may be, e.g., about 100 sccm. Optionally, the $O_2$ flow rate for the first sputtering atmosphere is less than about 10 sccm, and the NO flow rate for the first sputtering atmosphere is less than about 30 sccm.

The light absorption sub-layer 12 includes a metal oxynitride containing the same metal (e.g., a single metal or a combination of metals. e.g., as metal alloys or laminates) element for the metal sub-layer 11 and the sputtering target.

Optionally, the method further includes forming a light destructive interference sub-layer 13 by sputtering a metal/alloy sputtering target under a second sputtering atmosphere. The second sputtering atmosphere is nitrogen-free and has an increased oxygen content as compared to that for the light absorption sub-layer 12. The second sputtering atmosphere may be conveniently achieved by adjusting the flow rate of nitrogen-containing reactive gas (e.g., $N_2$) and/or oxygen-containing reactive gas (e.g., $O_2$) in the first sputtering atmosphere. For example, the second sputtering atmosphere may be achieved by discontinuing the nitrogen-containing reactive gas flow and increasing oxygen-containing reactive gas flow in the first sputtering atmosphere.

Optionally, the oxygen-containing reactive gas (e.g., $O_2$) flow rate for the second sputtering atmosphere is increased from less than about 10 sccm to less than about 30 sccm. An increase oxygen content in the sputtering atmosphere ensures the reaction between the sputtering target and the oxygen to form the light destructive interference sub-layer 13.

Optionally, the light destructive interference sub-layer 13 includes a multi-layer structure having two or more metal oxide sub-layers having different refractive indexes. Refractive indexes of the two or more light destructive interference sub-layers sequentially decrease along a direction away from the light absorption sub-layer 12. Oxygen molar contents of two or more light destructive interference sub-layers sequentially increase along a direction away from the light absorption sub-layer 12. Optionally, the two or more light destructive interference sub-layers are formed by sputtering a metal/alloy sputtering target sequentially under different oxygen-containing sputtering atmospheres. The oxygen contents of sputtering atmospheres corresponding to the two or more light destructive interference sub-layers along a direction away from the light absorption sub-layer 12 sequentially increase sequentially, thereby forming two or more light destructive interference sub-layers having refractive indexes sequentially decreasing along a direction away from the light absorption sub-layer 12.

Based on the above, the metal sub-layer 11, the light absorption sub-layer 12, and the light destructive interference sub-layer 13 may be formed in a single sputtering process by sequentially changing the sputtering atmosphere in the reaction chamber, greatly improving the manufacturing efficiency.

In another aspect, the present disclosure further provides a substrate including a conductive pattern having the conductive layer 10 described herein. The conductive portion in the conductive pattern is the metal sub-layer 11 in the conductive layer 10.

In some embodiments, the substrate is a display substrate such as an array substrate, a color filter on array substrate, a color filter substrate, and a touch control substrate.

Optionally, the array substrate includes an active layer made of an oxide (e.g., an oxide array substrate). Optionally, the array substrate includes an active layer made of a low temperature polysilicon (LTPS) material (e.g., a LTPS array substrate). Optionally, the array substrate includes an active layer made of an amorphous silicon (e.g., an amorphous silicon array substrate.

Optionally, the substrate is a touch control substrate. Optionally, the conductive pattern includes a bridging electrode for connecting touch sensing electrodes.

Optionally, the substrate is an array substrate or a color filter on array substrate. Optionally, the conductive pattern includes one or a combination of a gate electrode, a gate line, and a gate line lead wire. Optionally, the gate electrode, the gate line, and the gate line lead wire are all made of the conductive layer 10 as described herein. Due to the destructive interference of light in the light destructive interference sub-layer 13 and the enhanced light absorption in the light absorption sub-layer 12, reflection of light (e.g., either an ambient light or a backlight) on the surface of the metal sub-layer 11 can be eliminated or significantly reduced, obviating the need for a black matrix in the array substrate or a color filter on array substrate.

Optionally, the substrate is an array substrate or a color filter on array substrate. Optionally, the conductive pattern includes one or a combination of a source/drain electrode, a data line connected to the source/drain electrode, and a data line lead wire thereof. Optionally, the source/drain electrode, the date line connected to the source/drain electrode, and the date line lead wire thereof are all made of the conductive layer 10 as described herein. Due to the destructive interference of light in the light destructive interference sub-layer 13 and the enhanced light absorption in the light absorption sub-layer 12, reflection of light (e.g., either an ambient light or a backlight) on the surface of the metal sub-layer 11 can be eliminated or significantly reduced, obviating the need for a black matrix in the array substrate or a color filter on array substrate.

Optionally, the conductive layer 10 is a source/drain electrode in a thin film transistor, the source/drain electrode is electrically connected to the active layer on one side. In this case, the light absorption sub-layer 12 and the light destructive interference sub-layer 13 are disposed on only one side of the metal sub-layer 11, i.e., the side distal to the active layer. The Optionally, the substrate is an array substrate or a color filter on array substrate. Optionally, the conductive pattern is a common electrode line.

Figure 5:
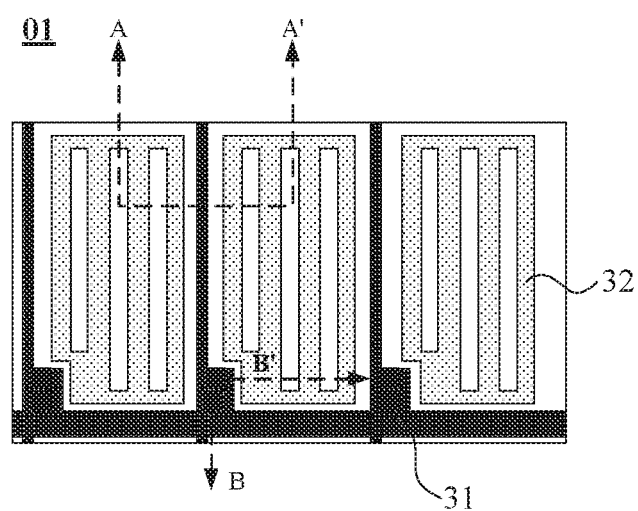
FIG. 5 is a plan view of a display substrate having a present conductive layer in some embodiments.

FIG. 5 is a plan view of a display substrate having a present conductive layer in some embodiments. Referring to FIG. 5, the substrate in the embodiment is a color filter on array substrate 01. The common electrode line 31 in FIG. 5 is made of the conductive layer 10 as described herein, i.e., the common electrode line 31 includes a metal sub-layer, a light absorption sub-layer 12 and a light destructive interference sub-layer 13. The common electrode line 31 is electrically connected to the common electrode, and extends throughout the area containing the gate electrode, the date line, and the thin film transistor.

Figure 6:
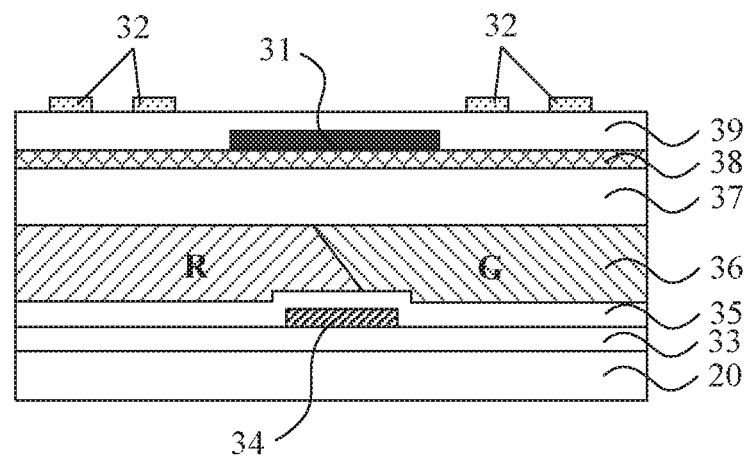
FIG. 6 is a cross-sectional view along the A-A' direction of the display substrate in FIG. 5.

FIG. 6 is a cross-sectional view along the A-A' direction of the display substrate in FIG. 5. Referring to FIG. 6, the color filter on array substrate in the embodiment includes a base substrate 20, and further includes a gate insulating layer 33, a data line 34, a first passivation layer 35, a color filter layer 36, an organic planarization layer 37, a common electrode 38, the common electrode line 31, a second passivation layer 39, and a pixel electrode 32, sequentially formed on the base substrate 20. The color filter layer may include a red color filter, a green color filter and a blue color filter. FIG. 6 only shows two color filters, i.e., the red color filter and the green color filter.

Figure 7:
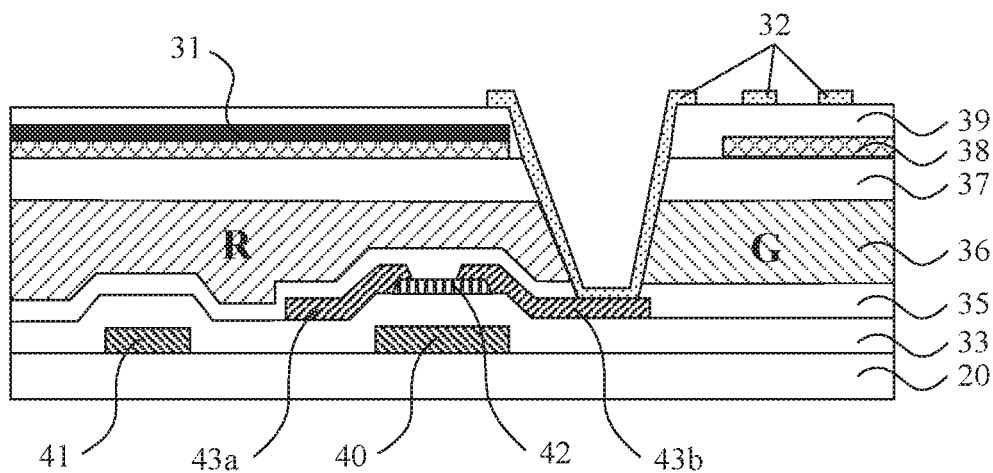
FIG. 7 is a cross-sectional view along the B-B' direction of the display substrate in FIG. 5.

FIG. 7 is a cross-sectional view along the B-B' direction of the display substrate in FIG. 5. Referring to FIG. 7, the color filter on array substrate in the embodiment further includes a gate electrode 40 and a gate line 41 between the base substrate 20 and the gate insulating layer 22; an active layer 42 on the gate insulating layer 33, a source electrode 43a and a drain electrode 43b on a side of the active layer distal to the gate insulating layer 33, and a first passivation layer 35 on a side of the source/drain electrode distal to the base substrate 20.

In another aspect, the present disclosure further provides a display apparatus having a substrate as described herein. Examples of display apparatuses include, but are not limited to, a liquid crystal display panel, a liquid crystal television, an organic light emitting display panel, a digital album, a mobile phone, a tablet computer, etc.

In some embodiments, the liquid crystal display panel or the liquid crystal television is of an advanced super dimensional switching (ADS) type, an in-plane switching (IPS) type, a twist nematic (TN) type, or a vertical align (VA) type.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A conductive layer in a semiconductor apparatus, comprising a metal sub-layer and an anti-reflective coating over the metal sub-layer for reducing light reflection on the metal sub-layer; wherein the anti-reflective coating comprises a light absorption sub-layer on the metal sub-layer for reducing light reflection by absorption and a light destructive interference sub-layer on a side of the light absorption layer distal to the metal sub-layer for reducing light reflection by destructive interference; and the metal sub-layer is made of a material comprising M1, wherein M1 is a single metal or a combination of metals; the light absorption sub-layer is made of a material comprising $M2O_aN_b$, wherein M2 is a single metal or a combination of metals, a>0, and b≥0; the light destructive interference sub-layer is made of a material comprising $M3O_c$, wherein M3 is a single metal or a combination of metals, and c>0; the light absorption sub-layer has a refractive index larger than that of the light destructive interference sub-layer.

2. The conductive layer of claim 1, wherein the light destructive interference sub-layer has a higher oxygen molar content than the light absorption sub-layer.

3. The conductive layer of claim 1, wherein the metal layer, the light absorption sub-layer and the light destructive interference sub-layer have at least one metal element in common.

4. The conductive layer of claim 1, wherein the light destructive interference sub-layer has a thickness of substantially about $(k*\lambda/4n)$, wherein k is an odd positive integer, $\lambda$ is a wavelength of an ambient light, and n is the refractive index of the light destructive interference sub-layer.

5. The conductive layer of claim 1, wherein the anti-reflective coating further comprises one or more additional sub-layer on a side of the light destructive interference sub-layer distal to the light absorption sub-layer, refractive indexes of the light destructive interference sub-layer and the one or more additional sub-layer sequentially decrease along a direction away from the light absorption sub-layer.

6. The conductive layer of claim 5, wherein the one or more additional sub-layer is made of a material comprising a metal oxide; oxygen molar contents of the light destructive interference sub-layer and the one or more additional sub-layer sequentially increase along a direction away from the light absorption sub-layer.

7. The conductive layer of claim 5, wherein the metal layer, the light absorption sub-layer, the light destructive interference sub-layer, and the one or more additional sub-layer have at least one metal element in common.

8. The conductive layer of claim 1, wherein the light absorption sub-layer has a refractive index in the range of about 3 to about 4; the light destructive interference sub-layer has a refractive index in the range of about 1 to about 2.

9. The conductive layer of claim 1, wherein M1 is selected from the group consisting of aluminum, chromium, copper, molybdenum, titanium, an aluminum/neodymium alloy, a copper/molybdenum alloy, a molybdenum/tantalum alloy, a molybdenum/niobium alloy; $M2O_aN_b$ is selected from the group consisting of $AlO_xN_y$, $CrO_xN_y$, $CuO_xN_y$, $MoO_xN_y$, $TiO_xN_y$, $Al_xNd_yO_zN_w$, $Cu_xMo_yO_zN_w$, $Mo_xTa_yO_zN_w$, $Mo_xN$-

$b_yO_zN_w$; and $M3O_c$ is selected from the group consisting of $AlO_x$, $CrO_x$, $CuO_x$, $MoO_x$, $TiO_x$, $Al_xNd_yO_z$, $Cu_xMo_yO_z$, $Mo_xTa_yO_z$, $Mo_xNb_yO_z$.

10. A substrate comprising the conductive layer of claim 1.

11. A display apparatus comprising the substrate of claim 10.

12. A method of fabricating a conductive layer in a semiconductor apparatus comprising a metal sub-layer and an anti-reflective coating for reducing light reflection on the metal sub-layer, the method comprising:
  forming a metal sub-layer on a substrate using a material comprising M1, wherein M1 is a single metal or a combination of metals;
  forming a light absorption sub-layer over the metal sub-layer for reducing light reflection by absorption using a material comprising $M2O_aN_b$, wherein M2 is a single metal or a combination of metals, a>0, and b≥0;
  forming a light destructive interference sub-layer on a side of the light absorption sub-layer distal to the metal sub-layer for reducing light reflection by destructive interference using a material comprising $M3O_c$, wherein M3 is a single metal or a combination of metals, and c>0;
  wherein the light absorption sub-layer has a refractive index larger than that of the light destructive interference sub-layer.

13. The method of claim 12, wherein the light destructive interference sub-layer has an oxygen molar content higher than the light absorption sub-layer.

14. The method of claim 12, wherein the light absorption sub-layer and the light destructive interference sub-layer are formed in a single sputtering process using a same sputtering target under different sputtering atmospheres achieved by adjusting a flow rate of one or more reaction gas.

15. The method of claim 14, wherein the single sputtering process comprises sequentially sputtering a metal material in a first atmosphere corresponding to formation of the light absorption sub-layer and a second atmosphere corresponding to formation of the light destructive interference sub-layer; the first atmosphere comprises an oxygen-containing reactive gas or a combination of an oxygen-containing reactive gas and a nitrogen-containing reactive gas; the second atmosphere is free of the nitrogen-containing reactive gas and has a higher oxygen content than the first atmosphere.

16. The method of claim 15, wherein the metal sub-layer, the light absorption sub-layer, and the light destructive interference sub-layer are formed in a single sputtering process, the single sputtering process further comprises sputtering the metal material in a third atmosphere prior to sputtering the metal material in the first atmosphere.

17. The method of claim 12, wherein the metal layer, the light absorption sub-layer and the light destructive interference sub-layer have at least one metal element in common.

18. The method of claim 12, wherein the light destructive interference sub-layer is formed to have a thickness of substantially about $(k*\lambda/4n)$, wherein k is an odd positive integer, $\lambda$ is a wavelength of an ambient light, and n is the refractive index of the light destructive interference sub-layer.

19. The method of claim 12, wherein the metal layer, the light absorption sub-layer, and the light destructive interference sub-layer are formed in a single sputtering process using a same sputtering target under different sputtering atmospheres achieved by adjusting a flow rate of one or more reaction gas.

20. The method of claim 12, wherein the light absorption sub-layer has a refractive index in the range of about 3 to about 4; the light destructive interference sub-layer has a refractive index in the range of about 1 to about 2.

* * * * *